United States Patent
Yang

(10) Patent No.: US 7,692,569 B2
(45) Date of Patent: Apr. 6, 2010

(54) METHODS AND APPARATUS FOR ROTATING A THERMOMETER CODE

(75) Inventor: Wenhua Yang, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/080,463

(22) Filed: Apr. 3, 2008

(65) Prior Publication Data

US 2009/0251347 A1    Oct. 8, 2009

(51) Int. Cl.
H03M 1/66    (2006.01)
H03M 1/10    (2006.01)

(52) U.S. Cl. .................. 341/144; 341/143; 341/155

(58) Field of Classification Search .............. 341/143, 341/144, 155
See application file for complete search history.

(56) References Cited

U.S. PATENT DOCUMENTS

| | | | | |
|---|---|---|---|---|
| 4,521,764 A * | 6/1985 | Burton | ........ | 341/138 |
| 5,138,317 A * | 8/1992 | Story | ........ | 341/144 |
| 6,218,977 B1 * | 4/2001 | Friend et al. | ........ | 341/148 |
| 6,266,002 B1 * | 7/2001 | Gong et al. | ........ | 341/150 |
| 6,281,828 B1 * | 8/2001 | Kimura et al. | ........ | 341/155 |
| 6,816,103 B2 * | 11/2004 | Jonsson et al. | ........ | 341/160 |
| 7,227,491 B2 * | 6/2007 | Doerrer et al. | ........ | 341/158 |
| 2004/0252041 A1 * | 12/2004 | Kwan | ........ | 341/144 |
| 2008/0079619 A1 * | 4/2008 | Sakurai et al. | ........ | 341/144 |

OTHER PUBLICATIONS

R. T. Baird and T. S. Fiez, "Linearity Enhancement of Multibit ΔΣ A/D and D/A Converters Using Data Weighted Averaging," *IEEE Transactions on Circuits and Systems—II: Analog and Digital Signal Processing*, Dec. 1995, pp. 753-762, vol. 42, No. 12.

M. R. Miller and C. S. Petrie, "A Multibit Sigma—Delta ADC for Multimode Receivers," *IEEE Journal of Solid-State Circuits*, Mar. 2003, pp. 475-482, vol. 38, No. 3.

* cited by examiner

*Primary Examiner*—Howard Williams
(74) *Attorney, Agent, or Firm*—Kenyon & Kenyon LLP

(57) ABSTRACT

In one aspect, an apparatus for data conversion is provided. The apparatus comprises a plurality of inputs whose values together define a thermometer code to be converted to an analog output signal on each of a plurality of successive time increments, a plurality of conversion elements, each configured to convert one of the values at the plurality of inputs into an output signal, a shift circuit having a plurality of outputs connected to the plurality of conversion elements, the shift circuit coupled between the plurality of inputs and the plurality of conversion elements, the shift circuit selectively providing the values at the plurality of inputs to the plurality of conversion elements on the plurality of outputs to apply a rotation on each of the plurality of successive time increments, the rotation being indicated by a rotation pointer, and a pointer circuit coupled to the shift circuit and adapted to generate the rotation pointer on each of the successive time increments based on the values at the plurality of outputs during a preceding time increment, the pointer circuit indicating to the shift circuit which of the values at the plurality of inputs are to be provided to which of the plurality of conversion elements on a current time increment.

14 Claims, 10 Drawing Sheets

| Element: | | | | | | | |
|---|---|---|---|---|---|---|---|
| S8 | T8(0) | T6(0) | T2(1) | T3(1) | T3(0) | T2(1) | T7(0) |
| S7 | T7(0) | T5(0) | T1(1) | T2(1) | T2(0) | T1(1) | T6(1) |
| S6 | T6(0) | T4(1) | T8(0) | T1(1) | T1(1) | T8(0) | T5(1) |
| S5 | T5(0) | T3(1) | T7(1) | T8(0) | T8(0) | T7(0) | T4(1) |
| S4 | T4(0) | T2(1) | T6(1) | T7(1) | T7(0) | T6(0) | T3(1) |
| S3 | T3(0) | T1(1) | T5(1) | T6(1) | T6(0) | T5(0) | T2(1) |
| S2 | T2(1) | T8(0) | T4(1) | T5(1) | T5(0) | T4(0) | T1(1) |
| S1 | T1(1) | T7(0) | T3(1) | T4(1) | T4(0) | T3(0) | T8(0) |

| | | | | | | | |
|---|---|---|---|---|---|---|---|
| Number of Ones: | 2 | 4 | 7 | 8 | 1 | 3 | 6 |
| Pointer: | 1 | 3 | 7 | 6 | 6 | 7 | 7 |
| Time Increment: | 1 | 2 | 3 | 4 | 5 | 6 | 7 |

Fig. 4

METHODS AND APPARATUS FOR ROTATING A THERMOMETER CODE

FIELD OF THE INVENTION

The present invention relates to data converters and, more particularly, to the use of thermometer codes with data converters.

BACKGROUND OF THE INVENTION

Analog-to-digital converters (A/D converters) are used to convert analog input signals into digital output signals so that the digital signals may be further processed in the digital domain. The digital signals have a sample rate (typically expressed in samples per second), wherein for each time increment the analog signal will be sampled and quantized into a digital value having a specified number of bits. For example, music on a compact disc is generally sampled at a rate of 44.1 kHz and quantized to values represented by 16 bits. A/D conversion, however, may be performed at any sampling rate and the digital values may be represented by any number of bits.

One example of an A/D converter includes a flash A/D converter. A flash A/D converter may operate by comparing an input signal to a set of reference voltage thresholds. The reference voltage thresholds may be created by applying a high voltage to one end of a series of resistors, applying a low voltage to the other end of the series of resistors, and tapping the connections between each adjacent pair of resistors to serve as a reference voltage threshold. For each of the reference voltage thresholds, a comparator may be used to compare the analog input signal to the reference voltage threshold, and the comparator may output a one when the analog input signal has a voltage greater than or equal to the corresponding reference voltage threshold, and a zero otherwise.

The output of the comparators is sometimes referred to as a thermometer code. The term "thermometer code" is descriptive of the output in that the "ones" move "up" the comparators as the voltage value of the analog input signal increases in a way that resembles the mercury moving up a thermometer as the temperature increases. The thermometer code may be used directly or may be converted into a digital signal with a specified number of bits to subsequently produce the digital representation of the analog input signal. A thermometer code may also be used to generate an analog signal. For example, the values of a thermometer code may be input into conversion elements that output a predetermined voltage (e.g., via voltage sources) depending on whether the associated value of the thermometer code is a one or a zero.

SUMMARY OF THE INVENTION

Some embodiments according to the present invention include an apparatus for data conversion is provided. The apparatus comprises a plurality of inputs whose values together define a thermometer code to be converted to an analog output signal on each of a plurality of successive time increments, a plurality of conversion elements, each configured to convert one of the values at the plurality of inputs into an output signal, a shift circuit having a plurality of outputs connected to the plurality of conversion elements, the shift circuit coupled between the plurality of inputs and the plurality of conversion elements, the shift circuit selectively providing the values at the plurality of inputs to the plurality of conversion elements on the plurality of outputs to apply a rotation on each of the plurality of successive time increments, the rotation being indicated by a rotation pointer, and a pointer circuit coupled to the shift circuit and adapted to generate the rotation pointer on each of the successive time increments based on the values at the plurality of outputs during a preceding time increment, the pointer circuit indicating to the shift circuit which of the values at the plurality of inputs are to be provided to which of the plurality of conversion elements on a current time increment.

Some embodiments according to the present invention include a method for rotating a thermometer code in a data converter, the thermometer code represented by binary values stored at a plurality of ordered inputs, each of the plurality of ordered inputs being selectively connected to a different one of a respective plurality of conversion elements, the method comprising receiving a first thermometer code to be rotated in a current time increment, receiving a second thermometer code that was previously rotated during a previous time increment, identifying a last of the plurality of ordered inputs that stored a value of 1 of the second thermometer code on the previous time increment, identifying a last conversion element of the plurality of conversion elements at which the identified last of the plurality of ordered inputs was attached on the previous time increment, and connecting a first of the plurality of ordered inputs that stores a value of 1 of the first thermometer code to a one of the plurality of conversion elements following the last conversion element.

Some embodiments include an apparatus comprising an A/D converter stage that outputs a first rotated thermometer code, the A/D converter stage comprising circuitry that generates a plurality of reference voltage thresholds, a plurality of comparators that each receive one of the reference voltage thresholds and generates one element of the first rotated thermometer code by comparing the reference voltage threshold to an analog input signal, and a shift circuit coupled between the circuitry that generates a plurality of reference voltage thresholds and the plurality of comparators and that applies a rotation to the connections between the plurality of reference voltage thresholds and the plurality of comparators on each of a plurality of successive time increments, the rotation being indicated by a rotation pointer, a pointer circuit coupled to the shift circuit and adapted to generate the rotation pointer based on a second rotated thermometer code from a preceding time increment, and a D/A converter stage that receives the first rotated thermometer code.

BRIEF DESCRIPTION OF THE DRAWINGS

FIG. 4 illustrates a process of rotating a thermometer code;

DETAILED DESCRIPTION

As discussed above, an A/D converter is used to convert an analog input signal into a digital output signal. Many different structures of A/D converters can be used, including for example, a flash A/D converter, a pipeline A/D converter, a delta-sigma A/D converter, etc. Some A/D converters may include a digital-to-analog (D/A) converter stage for converting an intermediate digital signal to an analog signal for further processing. For example, a delta-sigma A/D converter and a pipeline A/D converter may each include a D/A converter stage that operates in a feedback loop within the respective A/D converter.

The performance of an A/D converter may be limited by errors in the building blocks of the A/D converter. For example, an A/D converter may be implemented using electronic components having specific operating parameters or nominal values (e.g., a voltage source that specifies some nominal output value). Due to errors in manufacturing the electronic components, operating values may differ from the specified nominal values, adversely affecting the operation of the device in which the electronic component operates. One such error that may effect the operation of an A/D converter includes operating values in the voltage sources of a D/A converter included as part of an A/D converter. Some of these deleterious effects that result from errors in the components (e.g., voltage sources) of the A/D converter may be compensated for by using techniques such as dynamic element matching. Through the use of dynamic element matching, harmful low-frequency errors may be randomized or shaped into higher frequencies outside the signal band of interest, as discussed in further detail below.

Figure 1:
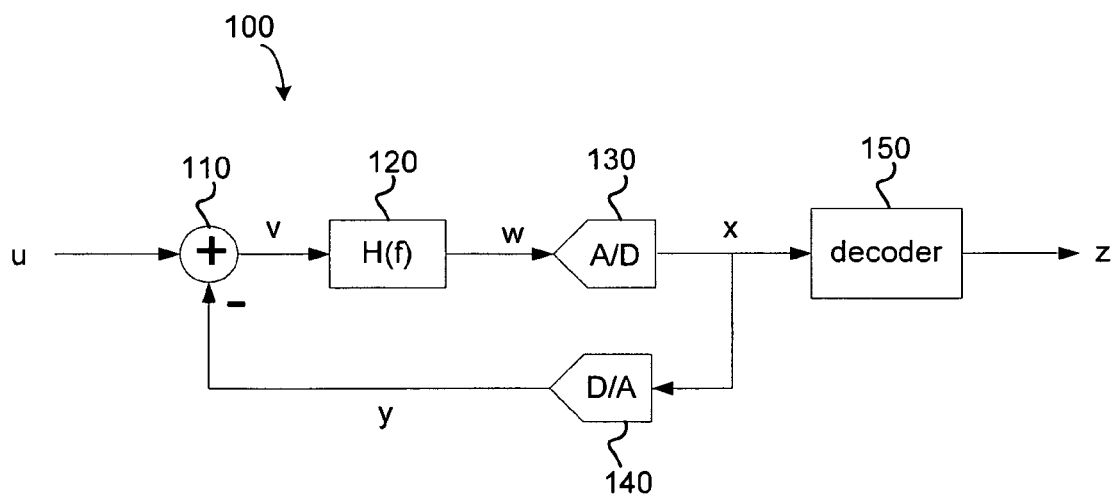
FIG. 1 illustrates a conventional delta-sigma A/D converter.

FIG. 1 illustrates a block diagram of a conventional delta-sigma A/D converter 100 that converts an analog input signal u into a digital output signal z. As illustrated, delta-sigma A/D converter 100 uses a feedback loop including D/A converter 140 as part of the conversion process. In a first stage of the delta-sigma A/D converter 100, adder 110 subtracts analog signal y, which is fed back from later stages of processing, from analog signal u to form analog signal v. In a second stage, filter 120 filters analog signal v to form analog signal w. Filter 120 may be an integrator, a low-pass filter, or any other suitable filter, or the converter may not need a filter 120 at all.

In a third stage, A/D converter 130 converts analog signal w into a digital signal x. Any suitable A/D converter can be used to produce digital signal x comprising one or more bits. In a feedback stage, D/A converter 140 converts the digital signal x into an analog signal y, which is fed back to adder 110. In a final stage, decoder 150 converts digital signal x into digital signal z, the output of delta-sigma A/D converter 100. The output digital signal z may comprise a same or a different number of bits than digital signal x, and forms the digital representation of the analog input signal u.

Figure 2A:
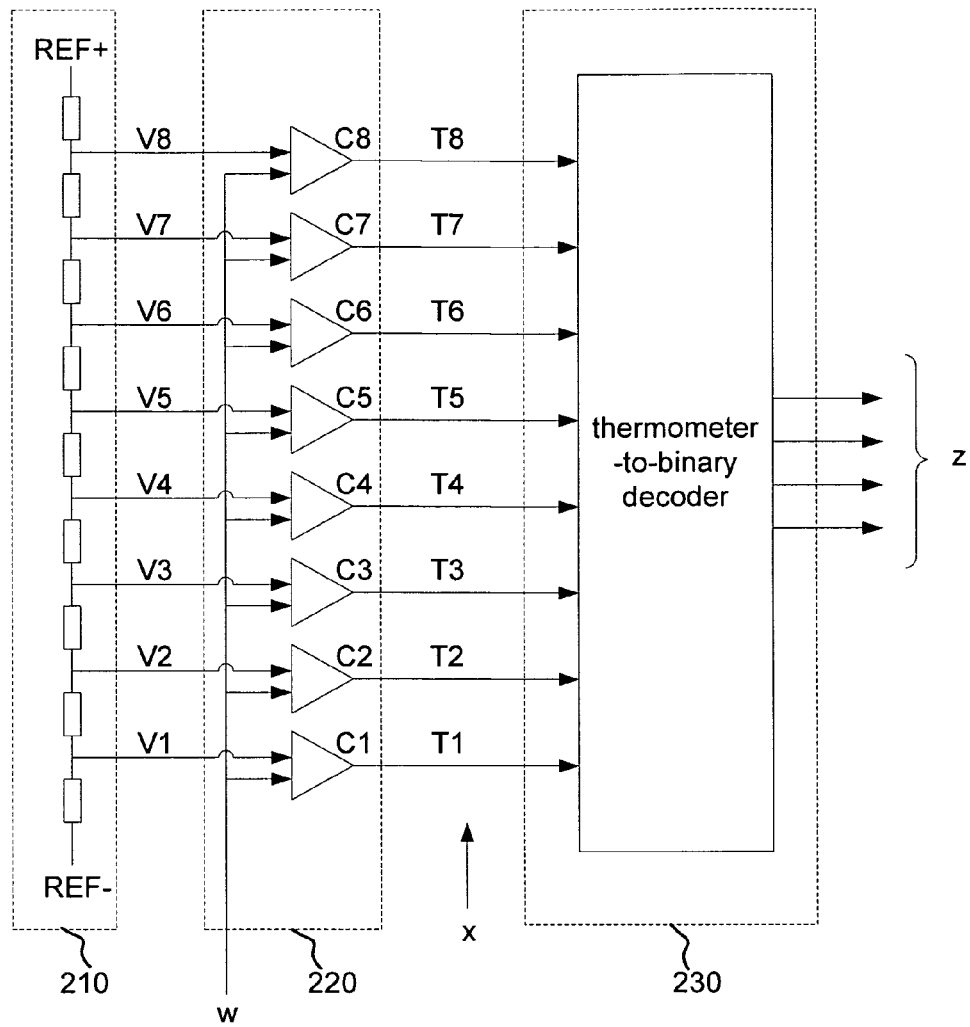
FIGS. 2a and 2b illustrate a conventional flash A/D converter.

Numerous A/D converters and decoders could be used in delta-sigma A/D converter 100 of FIG. 1. One example of a suitable A/D converter includes a flash A/D converter, and one example of a suitable decoder includes a thermometer-to-binary decoder. FIG. 2a illustrates components of a conventional flash A/D converter and thermometer-to-binary decoder that could be used to implement A/D converter 130 and decoder 150 of FIG. 1, respectively. The flash A/D converter of FIG. 2a comprises a block 210 that generates a set of reference thresholds and a block 220 that quantizes the analog input signal by comparing the voltage of the analog input signal to the voltage of the reference thresholds, as discussed in further detail below.

Reference-threshold block 210 generates a set of reference voltage thresholds V1-V8 against which the voltage of the analog input signal may be compared. As discussed above, the voltage thresholds may be generated, for example, by applying a high voltage REF+ to one end of a series of resistors and a low voltage REF− to the other end of the series of resistors. The voltage thresholds are the voltage values V1-V8 between consecutive resistors. Typically, the resistors are chosen to have nearly equal resistance so that the voltage thresholds are linearly and equally spaced, but other choices of resistors may also be selected. Reference-threshold block 210 illustrated in FIG. 2a generates eight voltage thresholds, but a different number of voltage thresholds may be used by simply changing the number of resistors.

Quantizer block 220 compares the value of analog input signal w with the values of voltage thresholds V1-V8. Comparators C1-C8 are used to perform the comparison, and each comparator indicates whether the analog input signal w is greater than or less than the respective voltage threshold. For example, comparator C1 compares analog signal w to voltage reference V1 and outputs a one (or high value) if the voltage of w is greater than or equal to V1 and outputs a zero (or low value) if the voltage of w is less than V1. The output of comparator C1 is denoted T1.

The output of quantizer block 220 is referred to as a thermometer code x that comprises the outputs T1-T8 of comparators C1-C8. As discussed above, the term "thermometer code" is used due to its resemblance to a conventional temperature thermometer, and the term does not otherwise imply any other meaning or restriction. As shown, the thermometer code comprises a plurality of ordered positions from T1-Tn, where n is the number of positions (e.g., n=8 in FIG. 2). Other codes may be used that digitize an analog signal based on the analog signal value, as the aspects of the invention are not limited in this respect. The thermometer code x indicates nine possible ranges for the voltage of analog input signal w. If the voltage of w is less than V1, then all of T1-T8 will be zero. If the voltage of w is greater than V1 but less than V2 then T1 will be one and T2-T8 will be zero. If the voltage of w is greater than V8, then all of T1-T8 will be one. The thermometer code x may thus represent a digital encoding of the analog input signal w.

Thermometer-to-binary decoder 230 may then convert the thermometer code to a binary representation (e.g., a digital representation of analog signal w). The decoder may operate by simply counting the number of ones in the thermometer code x and outputting the binary representation of that number. For the example in FIG. 2a, the thermometer code indicates nine levels and thus four bits are necessary to represent the value as a binary number. The output of decoder 230 is a digital signal z.

Figure 2B:
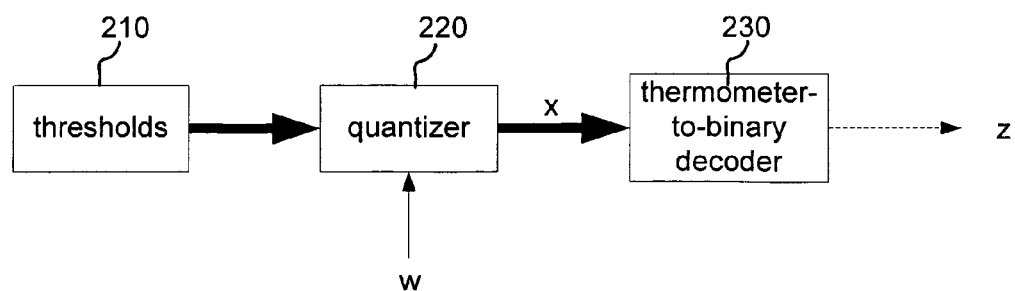

FIG. 2b shows a simplified block diagram of FIG. 2a. In particular, FIG. 2b illustrates a block diagram of FIG. 2a to show the relationship between the reference thresholds 210, quantizer 220, and thermometer to binary decoder 230. In FIG. 2b and subsequent block diagrams, thin arrows represent analog signals, thick arrows represent signals with multiple elements (such as the reference voltages and thermometer-coded signals), and dashed arrows represent digital signals.

Figure 3A:
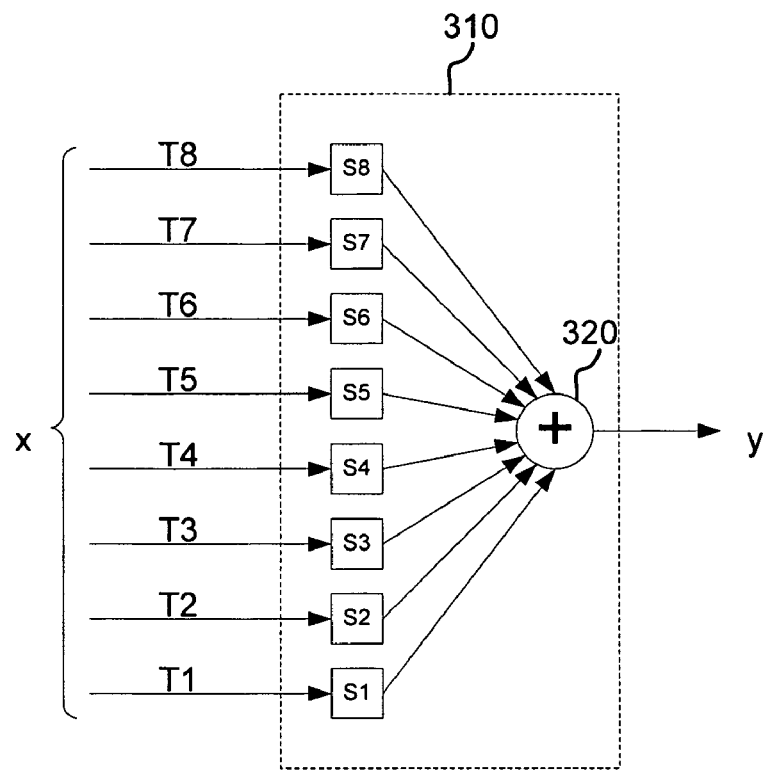
FIGS. 3a and 3b illustrate a conventional unary D/A converter.

As discussed above, some A/D converters may employ a D/A converter in a feedback loop, as shown in the example illustrated in FIG. 1 (e.g., D/A converter 140 in the feedback stage). Numerous D/A converters could be used for D/A converter 140 of FIG. 1. One example of a D/A converter that could be used is a unary D/A converter. FIG. 3a illustrates components of a conventional unary D/A converter that could be used to implement D/A converter 140 of FIG. 1. The unary D/A converter of FIG. 3a could also be used in conjunction with the flash A/D converter of FIGS. 2a and 2b.

The unary D/A converter 310 of FIG. 3a receives thermometer code x as an input and produces an analog signal y as output. The elements T1-T8 of thermometer code x are inputs to conversion elements S1-S8. Conversion elements S1-S8 convert the thermometer code into a plurality of corresponding voltage or current values. For example, the conversion elements S1-S8 may each contain a switch and a voltage (or current) source. The construction of such elements with a switch and a voltage or a current source is well known to one of ordinary skill in the art, and the details will not be described herein.

Figure 3B:
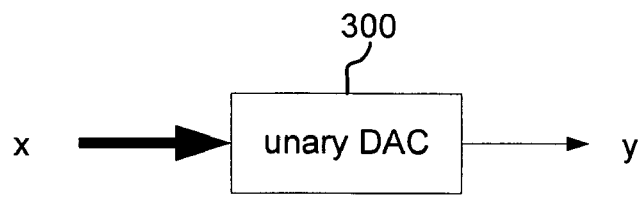

The values at the plurality of ordered position T1-T8 of the thermometer code may control the switches in conversion elements S1-S8, and the switch may be closed if the value at the corresponding position is one (or high) and open if the value at the corresponding position is zero (or low). When the switch is closed, the corresponding voltage source is activated, and when the switch is open, the corresponding voltage source is not activated. When the voltage sources of conversion elements S1-S8 are activated, the outputs of the conversion elements may supply a specified voltage, and when the voltage sources of conversion elements S1-S8 are not activated, the outputs may supply a zero voltage. The outputs are summed at block 320 to produce analog output y. The voltage sources may be designed to produce approximately the same voltage level when activated, but the voltage sources could be configured to produce different voltage levels, as the aspects of the invention are not limited in this respect. FIG. 3b illustrates a block diagram of FIG. 3a. It should be appreciated that the voltage sources could be replaced by current sources or other sources of electronic energy, as the aspects of the invention are not limited in this respect.

Ideally, the voltage sources of conversion elements S1-S8 should produce precisely the desired voltage. In practice, however, there will generally be small differences or errors between the desired or nominal voltage and the actual voltage. Typically, such errors will arise from manufacturing deviations of the electronic components that make up conversion elements S1-S8. However, deviation from nominal values may result from other factors as well (e.g., operating conditions such as heat, parasitic influences, etc.). If conversion elements S1-S8 are designed to produce a 1.00 volt output, S1 may output about 1.02 volts, S2 may output about 1.05 volts, and S3 may output about 0.97 volts. The errors in the outputs of conversion elements S1-S8 may cause errors in the output signal y of the unary A/D converter. For example, where T1 is one and T2-T8 are zero, the output signal y will have an error in the output of S1.

Such errors in the unary D/A converter of FIG. 3a may be shifted to higher frequencies through the process of dynamic-element matching. The higher frequencies may be outside the signal band of interest and filtered out in subsequent processing. With dynamic-element matching, the connections between the elements T1-T8 of the thermometer code and the conversion elements S1-S8 are dynamically rearranged so that their associations are changed. For example, during one clock cycle, element S1 may be connected to T2, and during another clock cycle, S1 may be connected to T7. Thus, instead of having a constant error associated with an element of the thermometer code, the errors will vary and shift from generally low frequencies to higher frequencies.

As discussed above, the thermometer code may comprise a plurality of ordered positions. The meaning of the term "ordered positions" herein denotes that the relative order of the elements T1-Tn remains the same and although the elements may be connected to different combinations of conversion elements, the elements T1-Tn are successively connected in the same order. That is, if element $T_i$ is connected to conversion element $S_j$, then element $T_{i+1}$ is connected to conversion element $S_{j+1}$, unless j=n in which case j becomes zero and the remaining elements $T_{i+1}$-Tn "wrap around" and are connected in order starting at S1. Accordingly, knowing the connection of one of the elements (sometimes referred to as a base element or base position) may describe all of the connections.

One method for performing dynamic element matching is to cyclically rotate the thermometer code on each clock cycle by a number of positions determined by the number of ones present in the thermometer code of the previous clock cycle or previous time increment. After rotation, the thermometer code inputs are connected to different conversion elements in a new configuration, which are shifted from the previous configuration by the determined number of positions. The term "rotate" or "rotating" when applied to a thermometer code indicates a shifting of the connections between the values at each of the positions of the thermometer code and the plurality of conversion elements.

For example, if T1-T3 are one and T4-T8 are zero, then a subsequent thermometer code may be rotated by three positions. A rotation involves shifting the connections between the values of the thermometer code while maintaining the order of the elements of the thermometer code. A pointer may be used to indicate to which of the conversion elements to connect the base position of the thermometer code, and the pointer may be incremented at each successive time increment based on the number of ones in the thermometer code. With this cyclical rotation, each of the conversion elements S1-S8 will be used an approximately equal number of times and errors associated with component deviation may be shifted into out-of-band frequencies and/or averaged out.

FIG. 4 illustrates an example of cyclically rotating a thermometer code. During the first time increment, the pointer is set to one so that T1 is associated with S1, T2 is associated with S2 and so on up the ordered positions of the thermometer code. The first thermometer code has two ones (i.e., at T1 and T2), and thus the pointer for the second time increment is incremented by 2 so that T1 is associated with S3, T2 is associated with S4 and so on up the ordered positions of the thermometer code. T7 and T8 wrap around and connect to S1 and S2, respectively. The second thermometer code has four ones and thus the pointer for the third time increment is incremented by 4 so that T1 is associated with S7, T2 is associated with S8, etc. As the thermometer code is rotated to new connections, the order of the positions of the thermometer code is retained. As described above, this rotation of the thermometer code will shift the errors created by the conversion elements from lower frequencies to higher frequencies and/or canceled out.

Figure 5A:
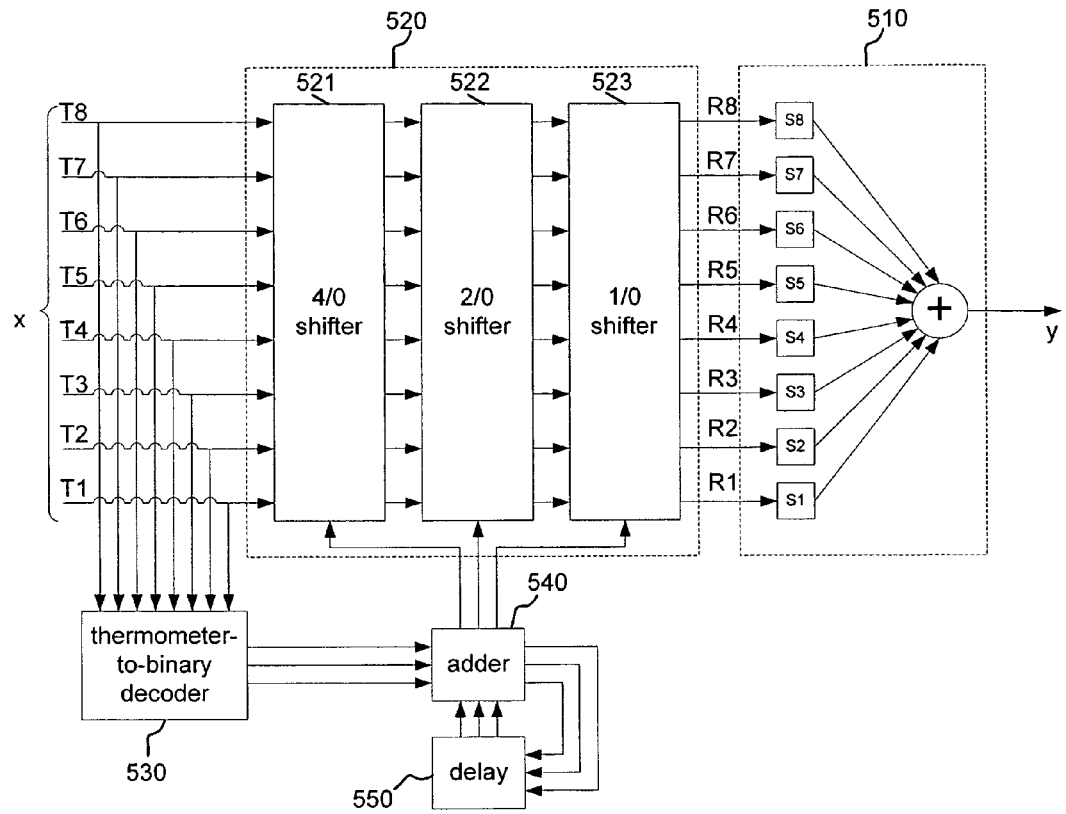
FIGS. 5a and 5b illustrate a conventional unary D/A converter with element-rotation mismatch shaping.

FIG. 5a illustrates a conventional unary D/A converter with element rotation. A shift circuit 520 is arranged between the elements T1-T8 of the thermometer code and the conversion elements S to rotate the connections based on an indicator from adder 540. Shift circuit 510 may be implemented as a barrel shifter or any other suitable implementation capable of shifting the connections. In FIG. 5a, shift circuit 520 is implemented by a barrel shifter composed of a sequence of multiplexers that allow a data word to be shifted by a specified number of bits. For the example using a thermometer code of length 8, the barrel shifter comprises three multiplexers. The first multiplexer 521 either shifts the thermometer code by four places or does no shifting at all, the second multiplexer 522 either shifts the thermometer code by two places or does no shifting at all, and the third multiplexer 523 either shifts the thermometer code by one place or does no shifting at all. The combination of the three multiplexers thus allows the thermometer code to be shifted from zero to seven places.

Figure 5B:
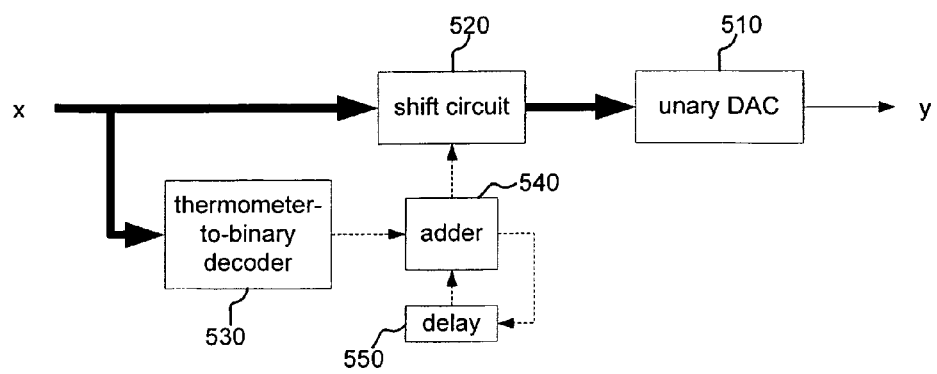

The shift circuit 520 is controlled by the output of adder 540. The adder outputs the value of the pointer shown in FIG. 4 in binary format, and each bit of the binary output controls one of the three multiplexers. Adder 540 determines the value of the pointer by adding its previous value to the number of ones present in the previous thermometer code. Adder 540 obtains its previous value through delay element 550 and obtains the number of ones in the thermometer code from the thermometer-to-binary decoder 530. With a thermometer code of length eight, the number of ones in the code can range from zero to 9, and thus four bits are necessary to represent the thermometer code in binary, and thermometer-to-binary decoder 230 outputs four bits. For the purposes of shifting the thermometer code, a shift of zero is equivalent to a shift of eight, and thus these two values can be combined. Thermometer-to-binary decoder 530 thus needs to output only eight values and only three bits are required. FIG. 5b illustrates a block diagram of FIG. 5a.

Applicant has appreciated that the determination of the pointer for the element rotation of FIGS. 5a and 5b can be accomplished more efficiently. The processing of blocks 530, 540, and 550 introduces a delay into the system that may limit the clock rate at which D/A converter 510 may operate. Further, the processing of blocks 530, 540, and 550 requires a significant amount of power. Applicant has appreciated that the rotated thermometer code (e.g., the thermometer code output from shift circuit 520) can be used to determine the pointer for the element rotation for the subsequent clock cycle without requiring the thermometer-to-binary-converter, adder and delay elements, thus reducing the delay and power consumption of the pointer generation and shifting circuitry.

As discussed above (e.g., as illustrated in FIG. 4), element T1 is matched up with the conversion element following the last conversion element to receive an element Tn having a value of 1. Thus, the transition from one to zero across the values R1-R8 of the rotated thermometer code in a given time increment indicates the conversion element $S_j$ to be matched up with T1 in a subsequent time increment (e.g., the following clock cycle). For example, in the first column of FIG. 4, the transition from one to zero occurs between elements S2 and S3, and thus T1 is matched up with S3, T2 is matched up with S4 and so on during the next time increment (e.g., on the next clock cycle). In the second column of FIG. 4, the transition from one to zero occurs between elements S6 and S7, and thus T1 is matched up with S7, T2 is matched up with T8, T3 wraps around and is matched up with S1 and so on during the next time increment. Two special cases exist that may need to be handled differently. Where the thermometer code is all ones or all zeros, there is no transition from one to zero. In this instance, all the conversion elements are being used or none of the conversion elements are being used, and thus the pointer may remain unchanged. That is, no rotation (or a rotation of zero) is performed.

Figure 6A:
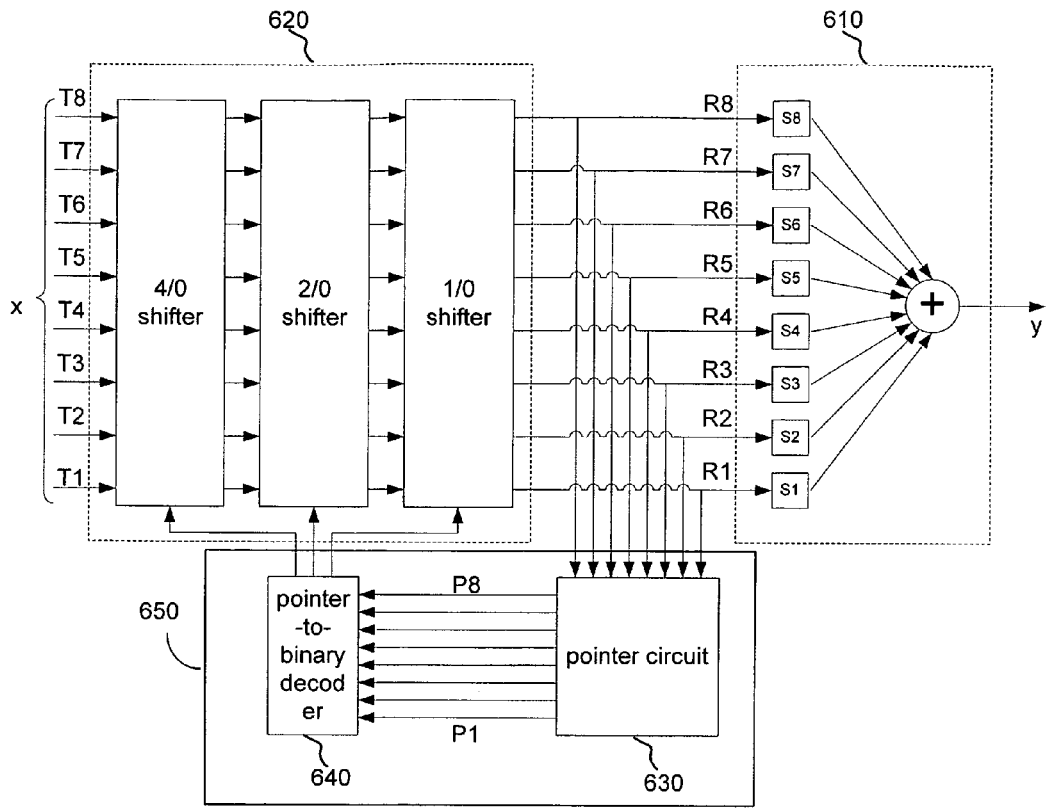
FIGS. 6a and 6b illustrate exemplary components of a unary D/A converter with element-rotation mismatch shaping and pointer calculation, in accordance with some embodiments of the present invention.

FIG. 6a illustrates a more efficient implementation for determining the pointer for rotating a thermometer code in a D/A converter, in accordance with some embodiments of the present invention. D/A converter 610 and shift circuit 620 may be the same or similar to the D/A converter and shifter circuit illustrated in FIG. 5a, but the method for determining the input to shift circuit 620 may be different. That is, rotation generation circuit 650 generates a pointer that incurs less delay and consumes less power than the implementation illustrated in FIG. 5a. In FIG. 6a, the input to shift circuit 620 is determined by pointer circuit 630 and a shift indicator circuit 640.

Pointer circuit 630 computes a pointer to indicate the rotation to be used in shift circuit 620 for the next cycle. The input to pointer circuit 630 is a rotated thermometer code that is currently being converted into an analog signal. The output of pointer circuit 630 indicates the rotation to be used in shift circuit 620 for the next time increment. From the perspective of the pointer circuit, a rotated thermometer code from a previous time increment is used to determine the rotation for a current time increment. The pointer generated by pointer circuit 630 may have one element for each of the possible rotations in shift circuit 620. The pointer may indicate the rotation to be used by, for example, outputting a value of 1 for the element $P_i$ corresponding to the conversion element that the base position of the thermometer code is to be matched up with, and outputting a zero for all other elements P. According to some embodiments, pointer circuit 630 includes logic circuits that detect a 1 to 0 transition, as discussed in further detail below.

Figure 6B:
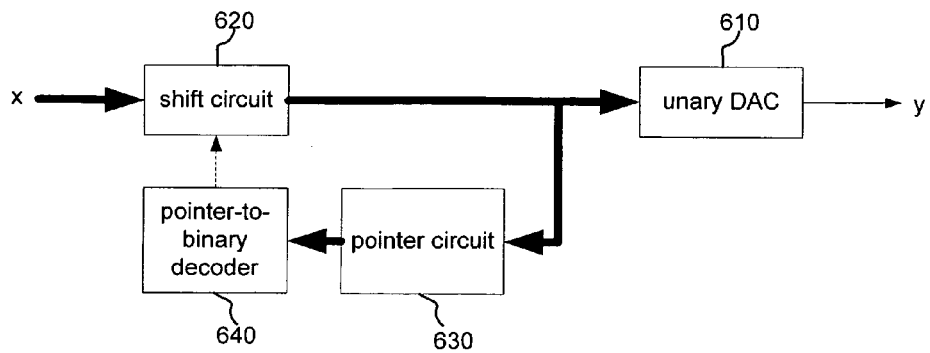

In FIG. 6a, shift indicator circuit 640 may convert the pointer received from pointer circuit 630 to a binary code to be input to shift circuit 620. As described above, the bits of the binary code may control the multiplexers comprising shift logic, e.g., a barrel shifter. The specific implementation of shift indicator circuit 640 is not a limitation of the invention and other implementations may be used. One example of an implementation of shift indicator circuit 640 is a lookup table in a memory which stores each possible combination of values at P1-Pn in association with the appropriate shift indicator to be provided to the shift circuit 620. Another example of shift indicator circuit 640 includes logic gates that convert the pointer value to the appropriate shift indicator. FIG. 6b illustrates a block diagram of FIG. 6a.

Figure 7:
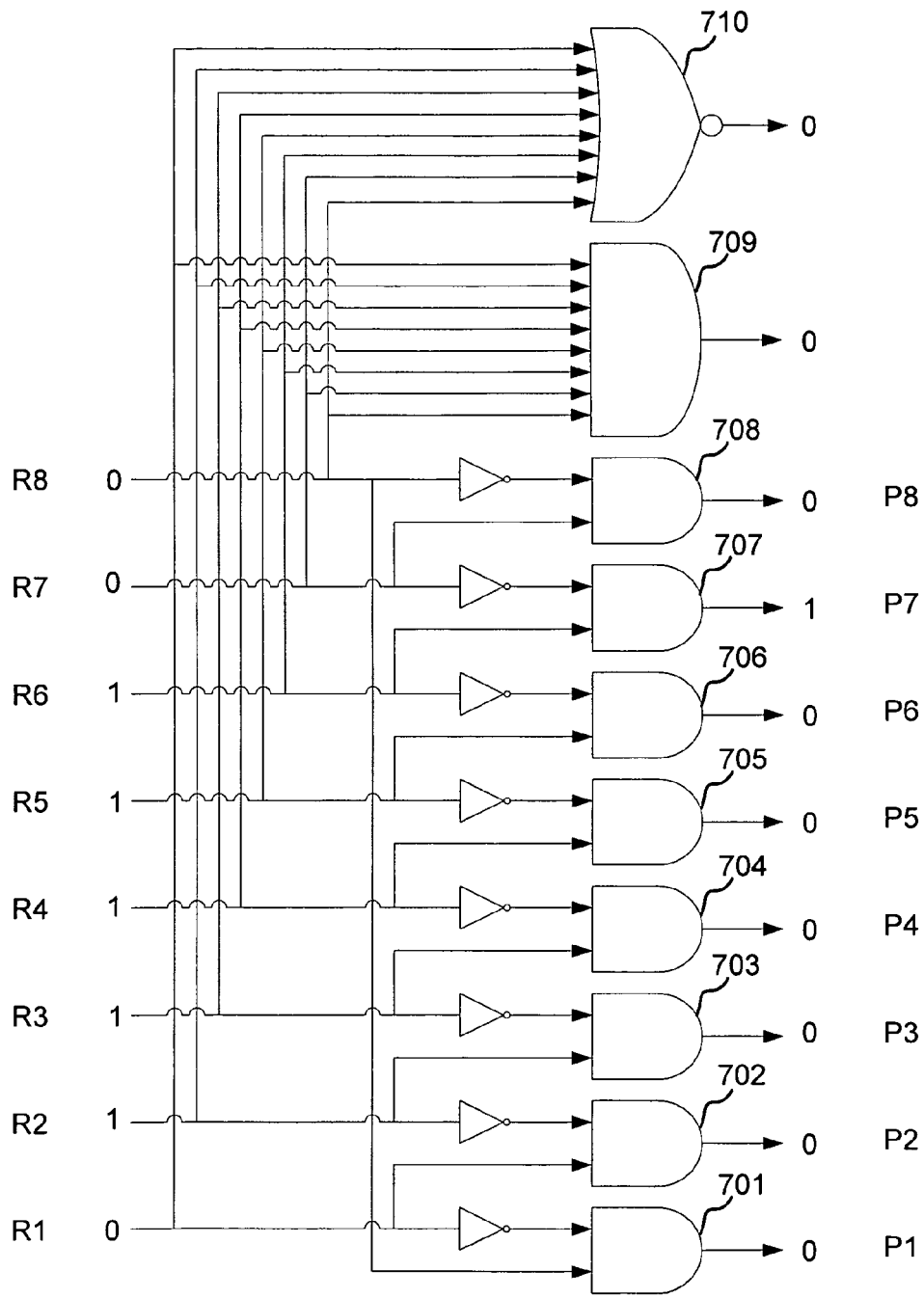
FIG. 7 illustrates a circuit for computing a pointer for thermometer code rotation, in accordance with some embodiments of the present invention.

FIG. 7 illustrates one example of a circuit that may be used to implement pointer circuit 630, in accordance with some embodiments of the present invention. In FIG. 7, R1-R8 represent the values of a rotated thermometer code being converted in a given time interval (e.g., values R1-R8 illustrated in FIG. 6a). The values of the rotated thermometer code are fed into logic gates that detect a transition from a one to a zero and also detect whether all of the values are zero or all the values are one. Logic gates 701-708 may include AND gates that receive two inputs. The first input may be an inverted element of the thermometer code input and the second input may be the element of the next lower number. For example, AND gate 707 takes R6 and inverted R7 as inputs. Logic gate 709 is an AND gate that determines whether all eight elements of the rotated thermometer code are one. Logic gate 710 may include a NOR gate that determines whether all eight elements of the rotated thermometer code are zero.

The output of these ten gates may be used to determine the pointer to the first conversion element to be used in the subsequent clock cycle. If the output of either gate 709 or gate 710 is one, then the pointer is the same as for the current cycle (i.e., no rotation is performed). If the output of gates 709 and 710 are both zero, then one of gates 701-708 has a value of one, and the gate with an output of one indicates the pointer for the subsequent cycle (i.e., indicates where the 1 to 0 transition occurs). The implementation of pointer circuit 630 is merely exemplary, other suitable implementations may be used, as the aspects of the invention are not limited in this respect. By removing the adder and delay circuit illustrated in FIG. 5a, the delay and power consumption associated with computing a rotation may be reduced, thus allowing the D/A converter to operate at higher speeds while consuming less power.

Applicant has appreciated further techniques to facilitate a more efficient process for rotating a thermometer code. As discussed above, shift circuit 620 in FIG. 6 may comprise a series of multiplexers (e.g., a barrel shifter). The propagation time for the thermometer code to pass through this series of multiplexers causes a delay that may limit the sampling rate at which the D/A converter can operate. Applicant has appreciated that the shift circuit can be implemented with a matrix shifter that reduces delay and increases the sampling rate at which the D/A converter can operate.

Figure 8A:
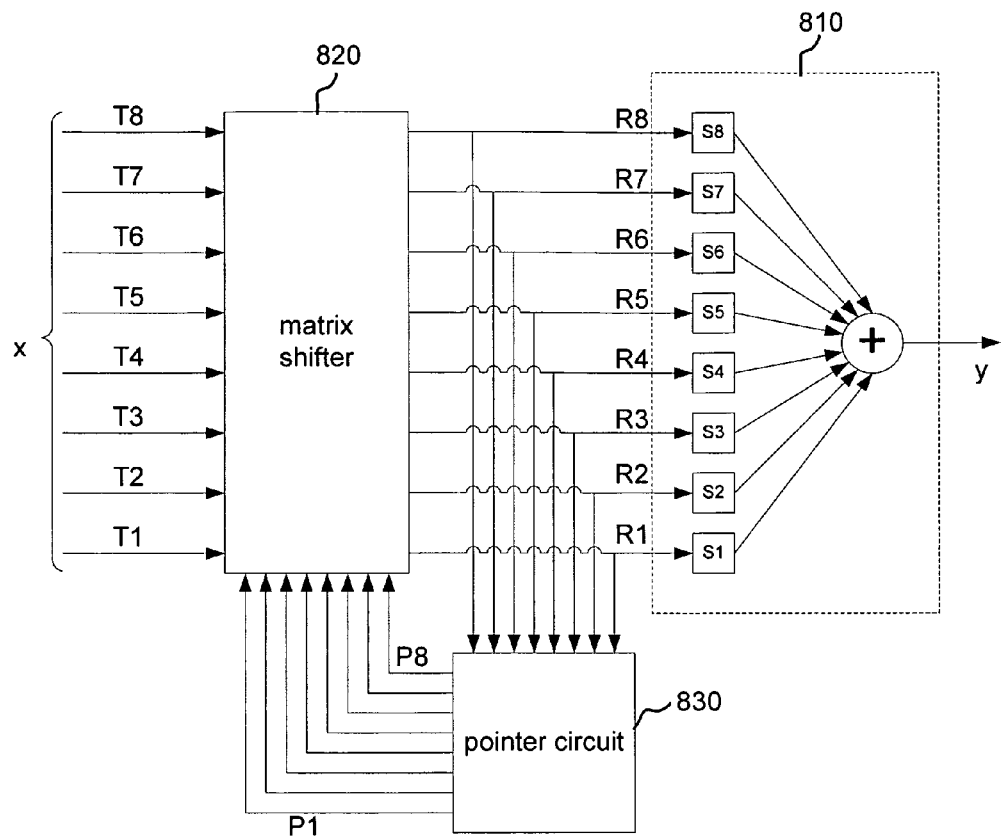
FIGS. 8a and 8b illustrate exemplary components of a unary D/A converter with element-rotation mismatch shaping, pointer calculation, and a matrix shifter, in accordance with some embodiments of the present invention.
Figure 8B:
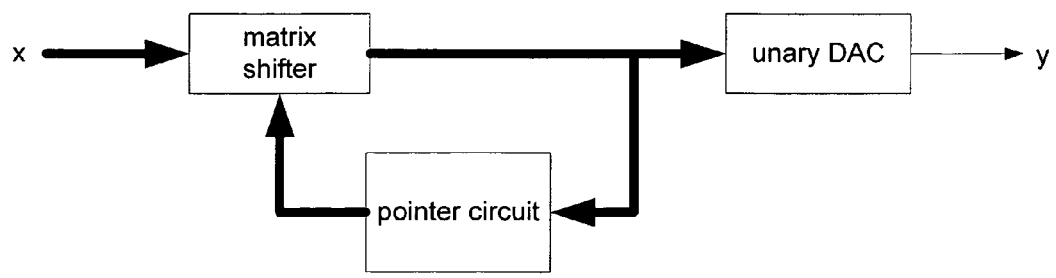

FIG. 8a illustrates a D/A converter with a matrix shifter, in accordance with some embodiments of the invention. D/A converter 810 and pointer circuit 830 may be similar or the same as shown in FIG. 6a, but the shift circuit 620 has been replaced by a matrix shifter 820. In FIG. 8a, the input to matrix shifter 820 is a pointer determined by pointer circuit 830. FIG. 8b illustrates a block diagram of FIG. 8a. As shown, the shift indicator circuit 640 has been removed and the output of the point circuit 830 is applied directly to the matrix shifter.

Figure 9:
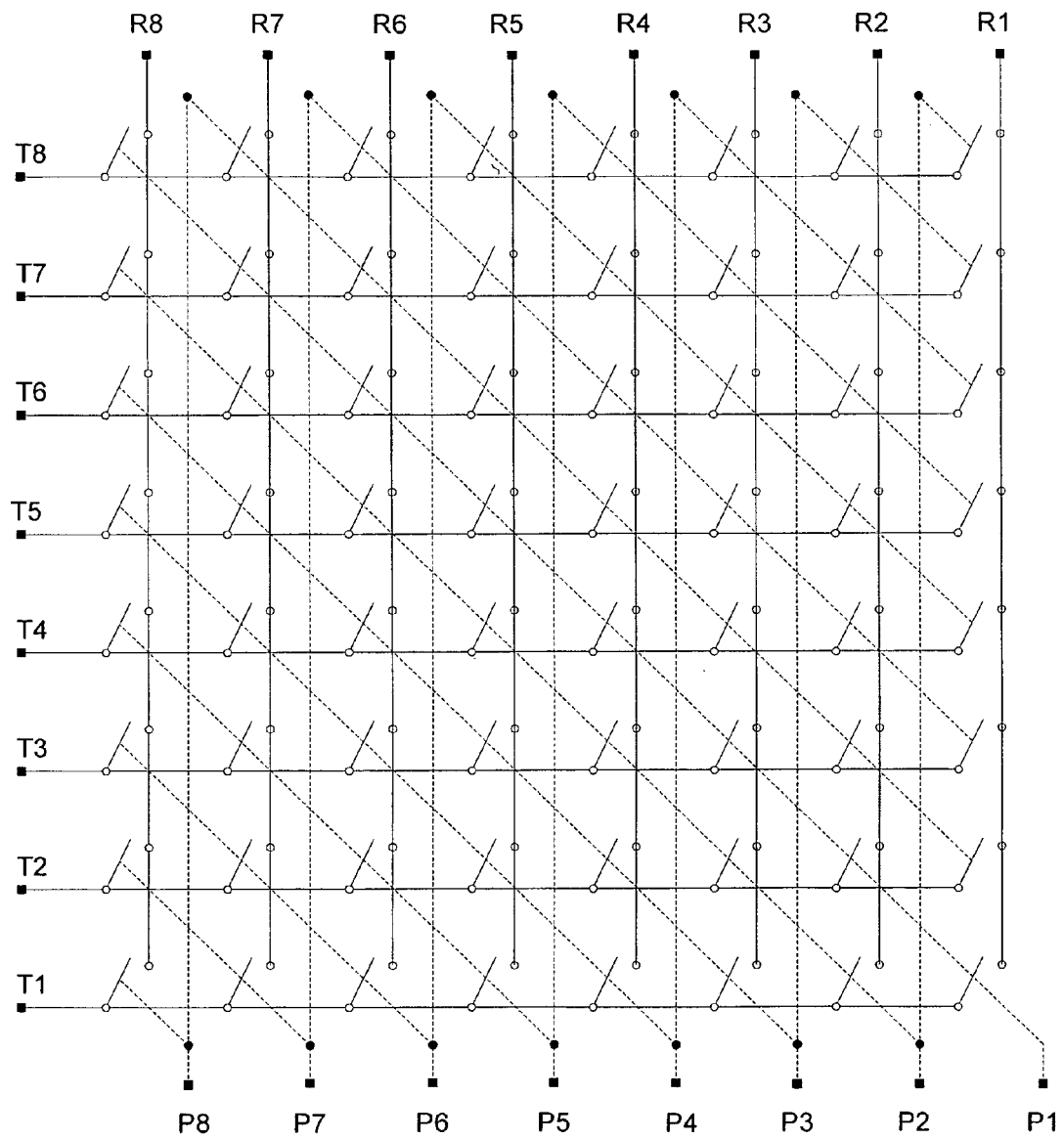
FIG. 9 illustrates a matrix shifter, in accordance with some embodiments of the present invention.

FIG. 9 illustrates a matrix shifter in accordance with some embodiments of the invention. The inputs to the matrix shifter are the elements T1-T8 of the thermometer code to be rotated and the elements P1-P8 of the pointer. The output of the matrix shifter are the elements R1-R8 of the rotated thermometer code rotated by an amount indicated by pointer circuit 830. The matrix shifter may contain switches that allow all possible rotations of the thermometer code. The elements P1-P8 of the pointer indicate the rotation to be applied to the thermometer code. As discussed above, the pointer elements P1-P8 indicate how the thermometer code at inputs T1-T8 should be rotated for a given time increment (e.g., by indicating a 1 to 0 transition in a previous time increment). For example, if P1 is one and the others are zero, the thermometer code is not rotated, but if P2 is one and the others are zero, the thermometer code is rotated by one position. The matrix shifter accomplishes the rotations by applying the proper switches as indicated by the value of the elements of the pointer P.

In FIG. 9, the connections between the switches and the elements of the pointer are indicated by dashed lines. When a given element of the pointer is one, all the switches connected to that element are closed. When a given element of the pointer is zero, all the switches connected to that element are open. For example, when P1 is one and P2-P8 are zero, T1 is connected to R1, T2 is connected to R2, and so forth. When P3 is one and P1-P2 and P4-P8 are zero, then T1 is connected to R3, T2 is connected to R4, and so forth. Accordingly, the matrix shifter can be used to implement thermometer code rotation without incurring the delay inherent in multiplexer structures such as a barrel shifter, and without the need for an intermediary shift indicator circuit.

Figure 10A:
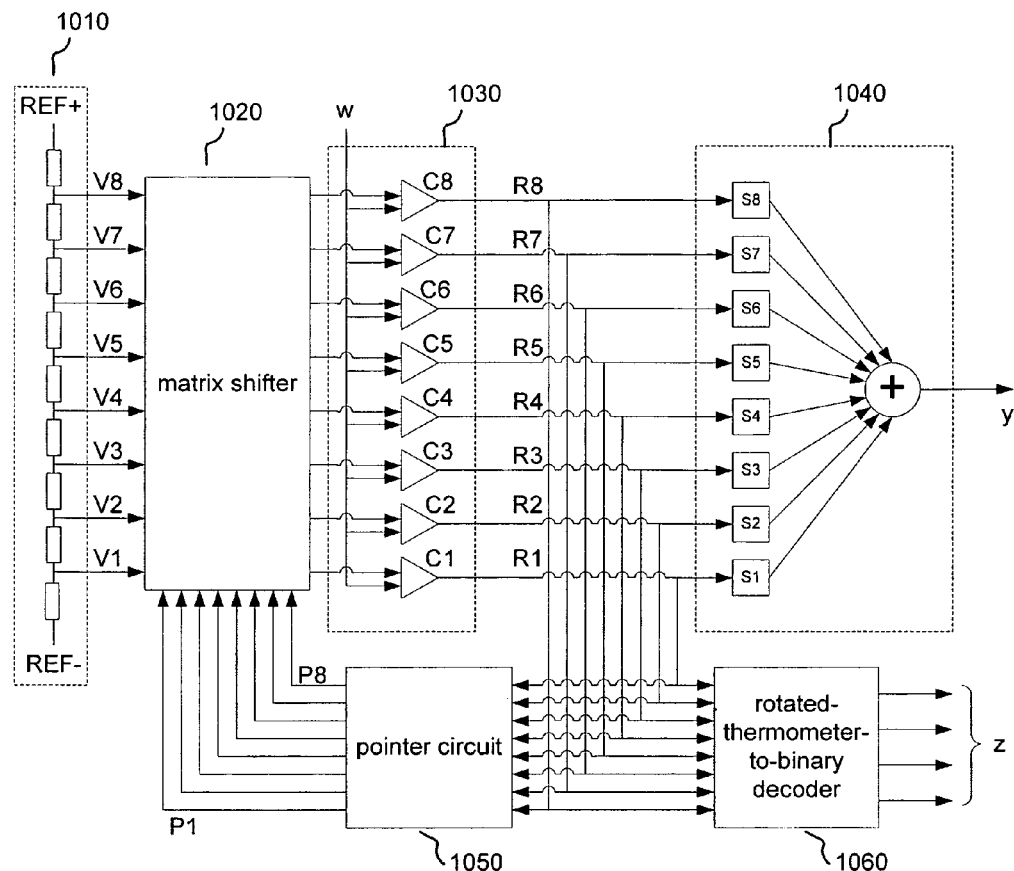
FIGS. 10a and 10b illustrate exemplary components of a flash A/D converter and a unary D/A converter where the element-rotation mismatch shaping is performed within the flash A/D converter, in accordance with some embodiments of the present invention.

Applicant has appreciated that further efficiencies may be achieved by incorporating thermometer code rotation in the A/D converter stage rather than the D/A converter stage. The rotation of the thermometer code in the D/A may negatively impact the operation of the A/D converter due to the processing burden of computing a desired rotation. The A/D converter may be made to operate faster by performing thermometer code rotation as part of the A/D conversion process. FIG. 10a illustrates exemplary components of an A/D converter stage followed by a D/A converter stage, in accordance with some embodiments of the invention. Some of the components of FIG. 10a may be similar to components described above. The reference-threshold block 1010 and quantizer block 1030 may be similar to reference-threshold block 210 and quantizer block 220 of FIG. 2a. Unary D/A converter 1040 may be similar to unary D/A converter 310 of FIG. 3a. Matrix shifter 1020 and pointer circuit 1050 may be similar to matrix shifter 820 and pointer circuit 830 of FIG. 8a, respectively.

However, in FIG. 10a, the location at which rotation is performed is modified. In FIG. 2a, the output of quantizer block 220 was the non-rotated thermometer code T1-T8. This non-rotated thermometer code T1-T8 of FIG. 2a was input into a D/A converter stage where the thermometer code T1-T8 was rotated to create the rotated thermometer code R1-R8. FIGS. 5a, 6a, and 8a show examples of a D/A converter stage that receive a non-rotated thermometer code T1-T8 as an input and performs the rotation to create a rotated thermometer code R1-R8.

Figure 10B:
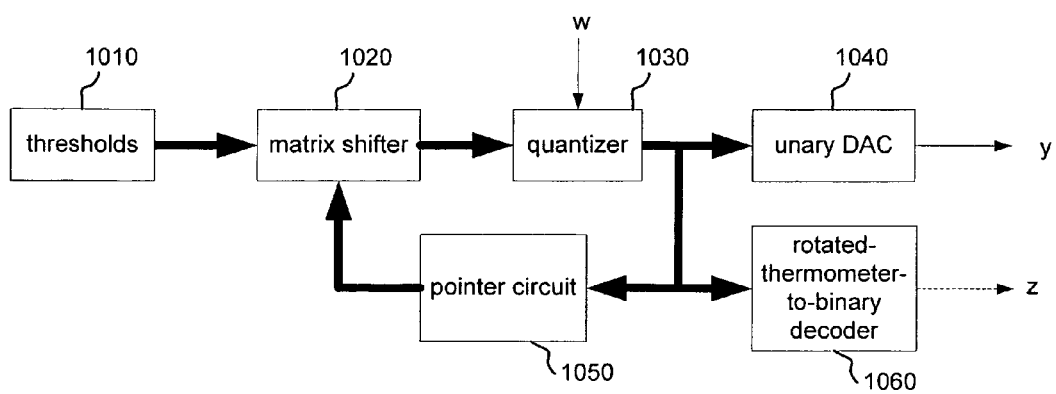

In FIG. 10a, the thermometer code is rotated in the A/D converter stage instead of in the D/A converter stage. The rotation of the thermometer code is accomplished by rotating the connections between the reference voltages V1-V8 and the comparators C1-C8. By rotating the reference voltages that are input to comparators C1-C8, the output of the quantizer stage is the rotated thermometer code R1-R8. The rotated thermometer code R1-R8 output from the quantizer block 1030 may be the same thermometer code R1-R8 that is produced in the D/A converter stages of FIGS. 5a, 6a, and 8a. The rotation of the thermometer code in the A/D converter stage of FIG. 10a is illustrated with a matrix shifter 1020 and a pointer circuit 1050. The specific method used to accomplish the rotation is not a limitation of the invention, however, and any suitable method may be used to accomplish the rotation. For example, the barrel shifter shown in FIGS. 5a and 6a could be used instead of the matrix shifter, in connection with a shift indicator circuit.

Where the A/D converter stage and D/A converter stage are used as components of a delta-sigma A/D converter as shown in FIG. 1, a decoder 150 may be used to create the digital output z of the delta-sigma A/D converter. FIG. 10a shows a rotated-thermometer-code-to-binary block 1060 that may be used to decode the digital signal. The decoder block 1060 may operate by simply counting the number of ones in the rotated thermometer code and outputting the binary representation of that number. For the example in FIG. 10a, the thermometer code indicates nine levels and thus four bits are necessary to represent the value in binary. The output of the decoder block 1060 is a digital signal z that is a digital representation of the analog input signal. FIG. 10b illustrates a block diagram of FIG. 10a.

The above-described embodiments of the present invention can be implemented in any of numerous ways. For example, the embodiments may be implemented using hardware, software or a combination thereof. It should be appreciated that any component or collection of components that perform the functions described above can be generically considered as one or more controllers that control the above-discussed function. The one or more controller can be implemented in numerous ways, such as with dedicated hardware, circuitry or with general purpose hardware (e.g., one or more processor) that is programmed using microcode or software to perform the functions recited above.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. The invention is capable of other embodiments and of being practiced or of being carried out in various ways.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. An apparatus comprising:
    a plurality of inputs whose values together define a thermometer code to be converted to an analog output signal on each of a plurality of successive time increments;
    a plurality of conversion elements, each configured to convert one of the values at the plurality of inputs into an output signal;
    a shift circuit having a plurality of outputs connected to the plurality of conversion elements, the shift circuit coupled between the plurality of inputs and the plurality of conversion elements, the shift circuit selectively providing the values at the plurality of inputs to the plurality of conversion elements on the plurality of outputs to apply a rotation on each of the plurality of successive time increments, the rotation being indicated by a rotation pointer; and
    an asynchronous pointer circuit coupled to the shift circuit and adapted to generate the rotation pointer on each of the successive time increments based on the values at the plurality of outputs during a preceding time increment, the pointer circuit indicating to the shift circuit which of the values at the plurality of inputs are to be provided to which of the plurality of conversion elements on a current time increment, wherein the pointer circuit includes an asynchronous gate assembly with N binary inputs $R_1$ to $R_N$ and with N binary outputs $P_1$ to $P_N$, wherein each respective output $P_i$ is defined by a binary function including $R_{(i-1)}$ and the inverse of $R_{(i)}$ combined by an AND-gate function.

2. The apparatus of claim 1, wherein the apparatus includes a digital-to-analog converter having a combination circuit to combine the output signal from each of the conversion elements to form the analog output signal.

3. The apparatus of claim 2, in combination with a delta-sigma analog-to-digital converter, the digital-to-analog converter included in a feedback loop of the delta-sigma analog-to-digital converter.

4. The apparatus of claim 1, wherein the shift circuit is implemented as a matrix shifter.

5. The apparatus of claim 1, wherein the shift circuit is implemented as a barrel shifter.

6. The apparatus of claim 1, wherein the pointer circuit generates the rotation pointer such that the rotation pointer indicates one of the plurality of conversion elements where the values at the plurality of inputs transitioned from a 1 to a 0 on the preceding time increment.

7. The apparatus of claim 6, wherein the plurality of inputs include n bits T1-Tn and the plurality of conversion elements include n conversion elements S1-Sn, and wherein the pointer circuit generates the rotation pointer such that the shift circuit provides the bit T1 to conversion element Si where Si is the conversion element following the conversion element at which the last of the plurality of inputs having a value of 1 was connected on the preceding time increment.

8. The apparatus of claim 1, wherein the asynchronous gate assembly includes two special case outputs including, an output defined by the function of an N bit AND-gate receiving the N binary inputs, and an output defined by the function of an N bit NOR-gate receiving the N binary inputs.

9. The apparatus of claim 1, wherein the apparatus is configured without a delay circuit.

10. An apparatus comprising:
    an A/D converter stage that outputs a first rotated thermometer code, the A/D converter stage comprising:
        circuitry that generates a plurality of reference voltage thresholds;
        a plurality of comparators that each receive one of the reference voltage thresholds and generates one element of a rotated thermometer code for a next time increment of a plurality of successive time increments by comparing the reference voltage threshold to an analog input signal; and
        a shift circuit coupled between the circuitry that generates a plurality of reference voltage thresholds and the plurality of comparators and that applies a rotation to connections between the plurality of reference voltage thresholds and the plurality of comparators on each of a plurality of successive time increments, the rotation being indicated by a rotation pointer;
    a pointer circuit coupled to the shift circuit and adapted to generate the rotation pointer based on a second rotated thermometer code from a same or preceding time increment, wherein the pointer circuit includes an asynchronous gate assembly with N binary inputs $R_1$ to $R_N$ and with N binary outputs $P_1$ to $P_N$, wherein each respective output $P_i$ is defined by a binary function including $R_{(i-1)}$ and the inverse of $R_{(i)}$ combined by an AND-gate function; and
    a D/A converter stage that receives the first rotated thermometer code.

11. The apparatus of claim 10, wherein the shift circuit is implemented as a barrel shifter or a matrix shifter.

12. The apparatus of claim 10, wherein the pointer circuit is implemented with logic gates that compare adjacent elements of the second rotated thermometer code to detect a transition from a value of 1 to a value of 0.

13. The apparatus of claim 10, wherein the A/D converter stage comprises a flash A/D converter.

14. The apparatus of claim 10, wherein the D/A converter stage comprises a unary D/A converter.

* * * * *